United States Patent
Takabayashi

(10) Patent No.: US 9,312,663 B2
(45) Date of Patent: Apr. 12, 2016

(54) LASER DEVICE, LIGHT MODULATION DEVICE, AND OPTICAL SEMICONDUCTOR DEVICE

(71) Applicant: FUJITSU LIMITED, Kawasaki-shi, Kanagawa (JP)

(72) Inventor: Kazumasa Takabayashi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/747,651

(22) Filed: Jun. 23, 2015

(65) Prior Publication Data
US 2015/0288148 A1     Oct. 8, 2015

Related U.S. Application Data

(63) Continuation of application No. PCT/JP2013/051761, filed on Jan. 28, 2013.

(51) Int. Cl.
*H01S 3/13*     (2006.01)
*H01S 5/50*     (2006.01)
(Continued)

(52) U.S. Cl.
CPC .............. *H01S 5/5045* (2013.01); *G02B 6/124* (2013.01); *H01S 3/0675* (2013.01);
(Continued)

(58) Field of Classification Search
CPC ..... H01S 5/0687; H01S 5/0287; H01S 5/125; H01S 5/141; H01S 5/14; H01S 5/146; H01S 5/5081
USPC .............................................. 372/32, 29.02, 6
See application file for complete search history.

(56) References Cited

U.S. PATENT DOCUMENTS

| 6,295,308 B1 * | 9/2001 | Zah ......................... H01S 5/026 372/50.1 |
| 2003/0063646 A1 * | 4/2003 | Yoshida .................... H01S 5/50 372/50.22 |

(Continued)

FOREIGN PATENT DOCUMENTS

| JP | 2003-508927 | 3/2003 |
| JP | 2003-174223 | 6/2003 |

(Continued)

OTHER PUBLICATIONS

International Search Report, mailed in connection with PCT/JP2013/051761 and mailed Feb. 19, 2013.
Written Opinion of the International Searching Authority mailed in in connection with PCT/JP2013/051761 mailed Feb. 19, 2013.

*Primary Examiner* — Kinam Park
(74) *Attorney, Agent, or Firm* — Fujitsu Patent Center

(57) ABSTRACT

A laser device includes an optical semiconductor device formed of a compound semiconductor material; and a wavelength-selective reflection device including optical waveguides. Further, the optical semiconductor device includes first and second gain waveguides, a DBR waveguide formed between the first and the second gain waveguides, first and second electrodes to inject current in the first and the second gain waveguides, and an antireflection film formed on a device facet to which the second gain waveguide is connected. The optical waveguides in the wavelength-selective reflection device reflect light having a predetermined wavelength from incident light in the optical waveguides. The first gain waveguide is optically coupled with the wavelength-selective reflection device, so that a laser resonator is formed by the DBR waveguide and the wavelength-selective reflection device, and the first gain waveguide functions as a gain medium.

20 Claims, 13 Drawing Sheets

(51) Int. Cl.
*H01S 5/0687* (2006.01)
*H01S 5/14* (2006.01)
*H01S 5/028* (2006.01)
*H01S 5/125* (2006.01)
*G02B 6/124* (2006.01)
*H01S 3/067* (2006.01)
*H01S 3/08* (2006.01)
*H01S 3/106* (2006.01)

(52) U.S. Cl.
CPC ........ *H01S 3/06716* (2013.01); *H01S 3/06791* (2013.01); *H01S 3/08004* (2013.01); *H01S 3/106* (2013.01); *H01S 5/0287* (2013.01); *H01S 5/0687* (2013.01); *H01S 5/125* (2013.01); *H01S 5/14* (2013.01); *H01S 5/141* (2013.01); *H01S 5/146* (2013.01); *H01S 5/5081* (2013.01)

(56) References Cited

U.S. PATENT DOCUMENTS

| | | | |
|---|---|---|---|
| 2008/0025358 A1* | 1/2008 | Arahira | H01S 5/06256 372/38.02 |
| 2009/0092159 A1 | 4/2009 | Kato | |
| 2010/0092175 A1* | 4/2010 | Kim | H01S 5/0608 398/79 |

FOREIGN PATENT DOCUMENTS

| | | |
|---|---|---|
| JP | 2008-034657 | 2/2008 |
| JP | 2009-059729 | 3/2009 |
| JP | 2010-027664 | 2/2010 |
| JP | 2010-239007 | 10/2010 |
| JP | 2011-253930 | 12/2011 |
| WO | 01/17077 | 3/2001 |

* cited by examiner

LASER DEVICE, LIGHT MODULATION DEVICE, AND OPTICAL SEMICONDUCTOR DEVICE

CROSS-REFERENCE TO RELATED APPLICATION

This application is a continuation application of International Application PCT/JP2013/051761 filed Jan. 28, 2013 and designating the U.S., the entire contents of which are incorporated herein by reference.

FIELD

The embodiments discussed herein are related to a laser device, a light modulation device, and an optical semiconductor device.

BACKGROUND

As a light source for optical fiber communications and optical interconnection, a laser device has been proposed which has a structure where an optical semiconductor device, which is made of a compound semiconductor, and a silicon (Si) optical waveguide are hybrid integrated. Such a laser device has features to be operated with less energy consumption and to be formed in smaller size. As a light modulation device using such a laser device, there is a light modulation device having a structure of a laser device 900 and a ring assist optical modulator 960 as illustrated in FIG. 1.

As illustrated in FIG. 2, the laser device 900 includes an optical semiconductor device 910, which is called a Semiconductor Optical Amplifier (SOA), and a wavelength-selective reflection device 950 in which optical waveguides are formed. In the optical semiconductor device 910, there are formed a gain waveguide 911. Further, an antireflection film 912 is formed on one surface which is one of end surfaces of the gain waveguide 911. From the one surface of the gain waveguide 911, light is emitted. Further, a high reflection film 913 is formed on the other surface which is the other of the end surfaces of the gain waveguide 911.

The wavelength-selective reflection device 950 includes a first optical waveguide 951, a ring resonator 952, a second optical waveguide 953, and a wavelength-selective reflection mirror 954 which is formed in the second optical waveguide 953. The optical semiconductor device 910 and the wavelength-selective reflection device 950 are installed in a manner such that an emission end 911a of the gain waveguide 911, which corresponds to the one surface of the optical semiconductor device 910, and an incident end 951a, from which light is incident into the first optical waveguide 951 of the wavelength-selective reflection device 95, face each other.

Further, as illustrated in FIG. 1, the ring assist optical modulator 960 includes a first modulator optical waveguide 961 and a second modulator optical waveguide 962. The first modulator optical waveguide 961 and the second modulator optical waveguide 962 are connected to each other on the light incident side by an optical waveguide 965 and on the light emission side by an optical waveguide 966. Further, near a side part of the first modulator optical waveguide 961, plural ring resonators 963 are provided. Further, near a side part of the second modulator optical waveguide 962, plural ring resonators 964 are provided.

In the laser device 900, a resonator is formed by the high reflection film 913, which is formed on the other surface of the optical semiconductor device 910, the ring resonator 952, which is formed in the wavelength-selective reflection device 950, and the wavelength-selective reflection mirror 954. Accordingly, in the laser device 900, by flowing a current, etc., in the optical semiconductor device 910, light is emitted. Then, the emitted light, which is emitted in the optical semiconductor device 910, is laser-oscillated by the resonator, etc., so that laser light is emitted from an output end 953a (FIG. 2) of the second optical waveguide 953.

The laser light, which is emitted from the wavelength-selective reflection device 950, is incident in the ring assist optical modulator 960, and travels through the optical waveguide 965 which is formed on the incidence side. The laser light, then, is divided into laser light to travel through the first modulator optical waveguide 961 and laser light to travel through the second modulator optical waveguide 962. In the ring assist optical modulator 960, it is possible to change the phase of the traveling light by, for example, applying a voltage to the first modulator optical waveguide 961 or the second modulator optical waveguide 962. After that, the laser light traveling through the first modulator optical waveguide 961 and the laser light traveling through the second modulator optical waveguide 962 are coupled, and the coupled laser light is output from an output end 966a of the optical waveguide 966 which is formed on the emission side. Here, the laser lights, which propagate through the first modulator optical waveguide 961 and the second modulator optical waveguide 962 are coupled at the optical waveguide 966. The laser light intensity emitted from the output end 966a is depend on the phase difference between the first modulator optical waveguide 961 and the second modulator optical waveguide 962. Therefore, the laser light emitted from the output end 966a modulated. Further, in the optical modulator having the structure of FIG. 1, the wavelength-selective reflection device 950 and the ring assist optical modulator 960 are formed on the same silicon substrate 970.

In such a ring assist optical modulator 960, an operation wavelength band where light modulation can be performed efficiently is narrow such as approximately 1 nm near the resonance wavelength. Therefore, it is desired that the oscillation wavelength of the laser device as a light source is the same as the resonance wavelength of the ring(s) of the ring assist optical modulator 960. As a technique to realizes such a relationship between the oscillation wavelength and the resonance wavelength, the laser device 900 as described above is disclosed which includes the optical semiconductor device 910 and the wavelength-selective reflection device 950 and the ring assist optical modulator 960 which are formed on the same silicon substrate 970. Further, the ring resonator 952, which is in the wavelength-selective reflection device 950, and the ring resonators 963 and 964 are formed in a manner such that the ring resonators 952, 963, and 964 have the same structure.

In such a laser device 900, the oscillation wavelength of the laser light can be determined by selecting one of the transmission center wavelengths, which are periodically spaced apart from each other, of the ring resonator 952 by using the wavelength-selective reflection mirror 954 in the wavelength-selective reflection device 950.

In the case of FIG. 1, as described above, the ring resonator 952 and the ring resonators 963 and 964 are formed so as to have the same cycle length. In such a structure, transparent wavelengths of the ring resonator 952 coincides with that of the ring resonators 963 and 964 are automatically unified. Therefore, it becomes possible to emit the laser light having the operating wavelength of the ring assist optical modulator 960 from the laser device 900 without any specific control. Further, in a case where the wavelength-selective reflection device 950 and the ring assist optical modulator 960 are formed on the same silicon substrate 970, even when a temperature of the silicon substrate 970 changes, the operations are obtained. Namely, even when a temperature change of the silicon substrate 970 occurs, the temperature is increased or decreased in the silicon substrate 970 as a whole. Therefore, the waveform shift occurs in the same manner in both the ring resonator 952 and the ring resonators 963 and 964. Therefore, it is possible to maintain a stable operation even when the temperature of the silicon substrate 970 changes.

Reference is made to Japanese Laid-open Patent Publication No. 2011-253930.

SUMMARY

According to an aspect of the present application, a laser device includes an optical semiconductor device formed of a compound semiconductor material; and a wavelength-selective reflection device including optical waveguides. Further, the optical semiconductor device includes a first gain waveguide, a second gain waveguide, a DBR waveguide formed between the first gain waveguide and the second gain waveguide, a first electrode to inject current in the first gain waveguide, a second electrode to inject current in the second gain waveguide, and an antireflection film formed on a device end surface to which the second gain waveguide is connected. The optical waveguides in the wavelength-selective reflection device reflect light having a predetermined wavelength from incident light to the optical waveguides, and the first gain waveguide is optically coupled with the wavelength-selective reflection device, so that a laser resonator is formed by the DBR waveguide and the wavelength-selective reflection device, and the first gain waveguide functions as a gain medium.

The object and advantages of the invention will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENTS

Figure 1:
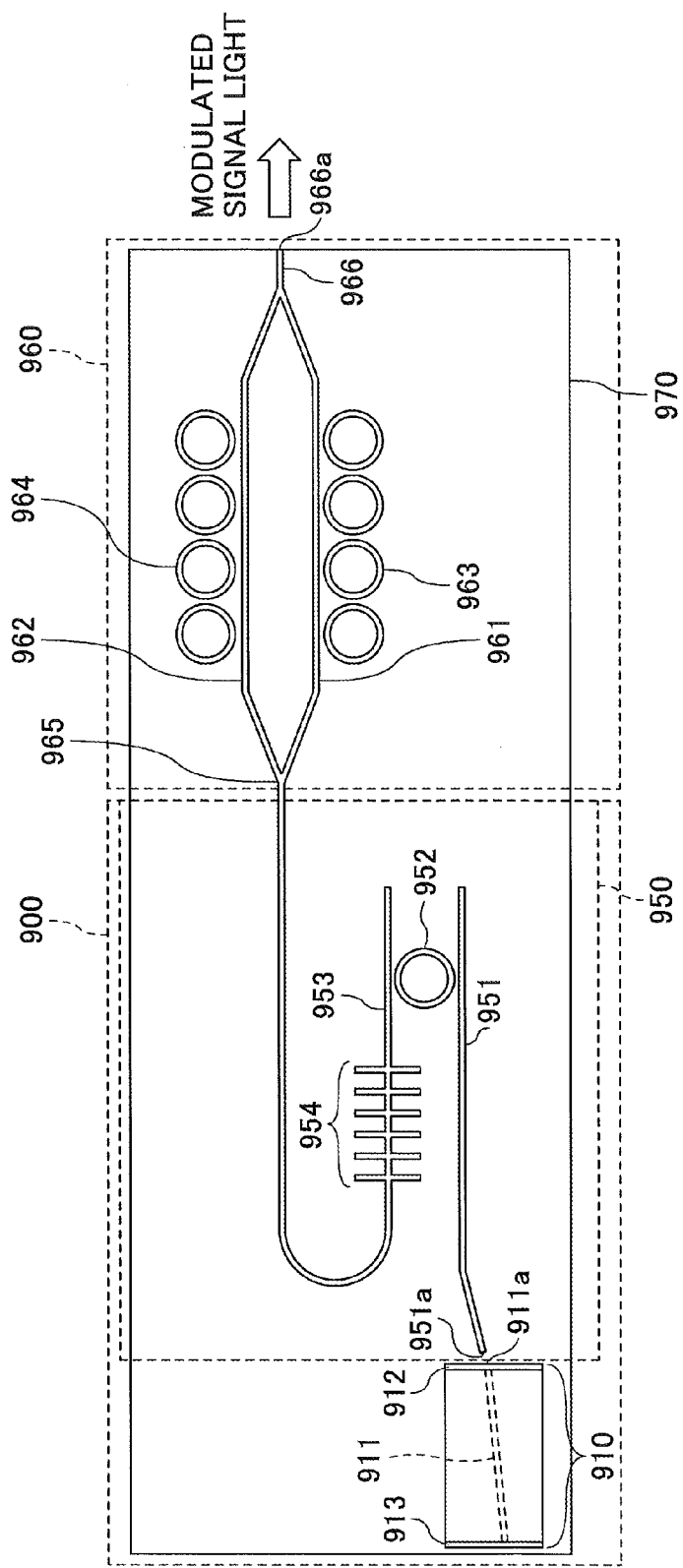
FIG. 1 illustrates an example structure of a conventional light modulation device.
Figure 2:
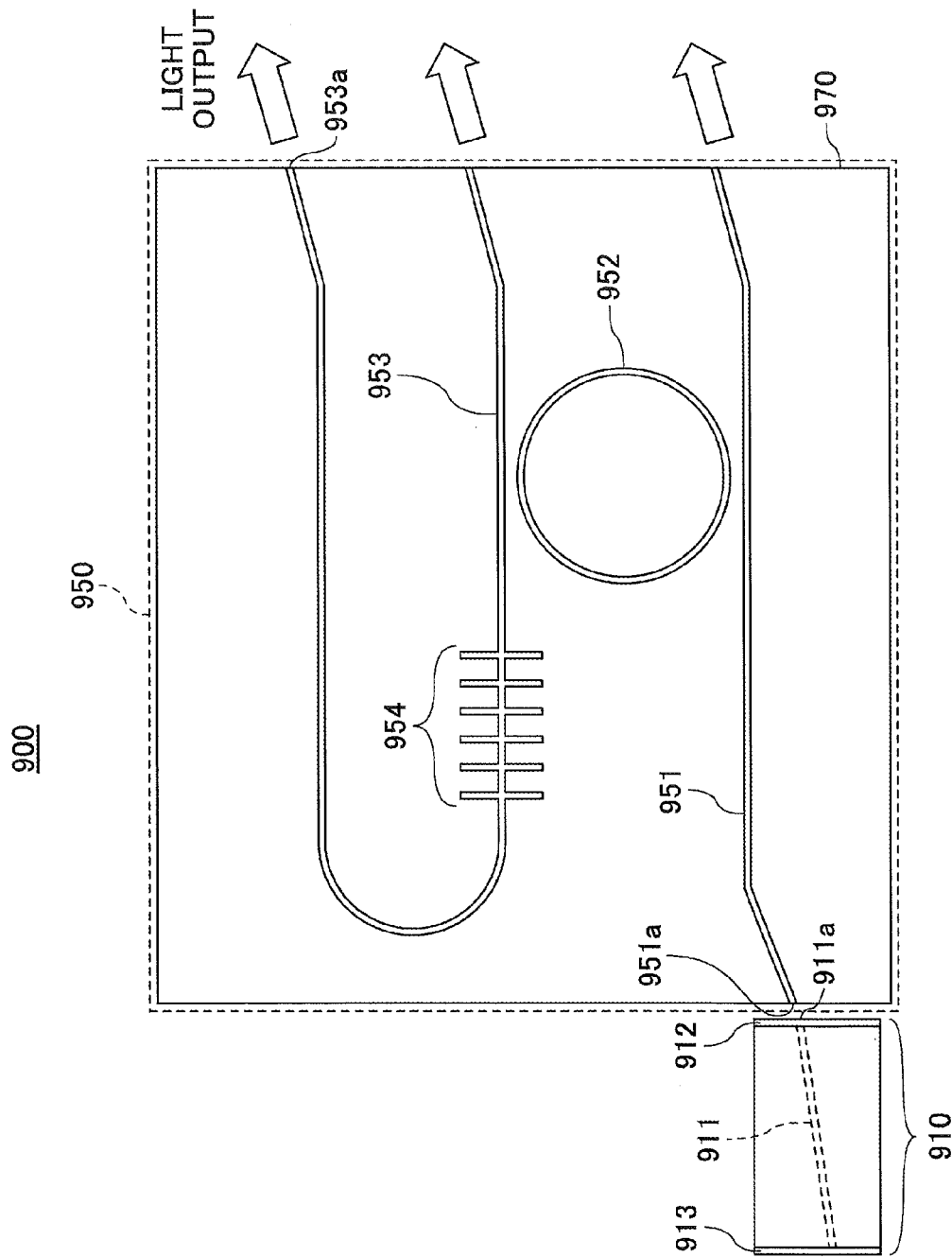
FIG. 2 illustrates an example structure of a conventional laser device.
Figure 3:
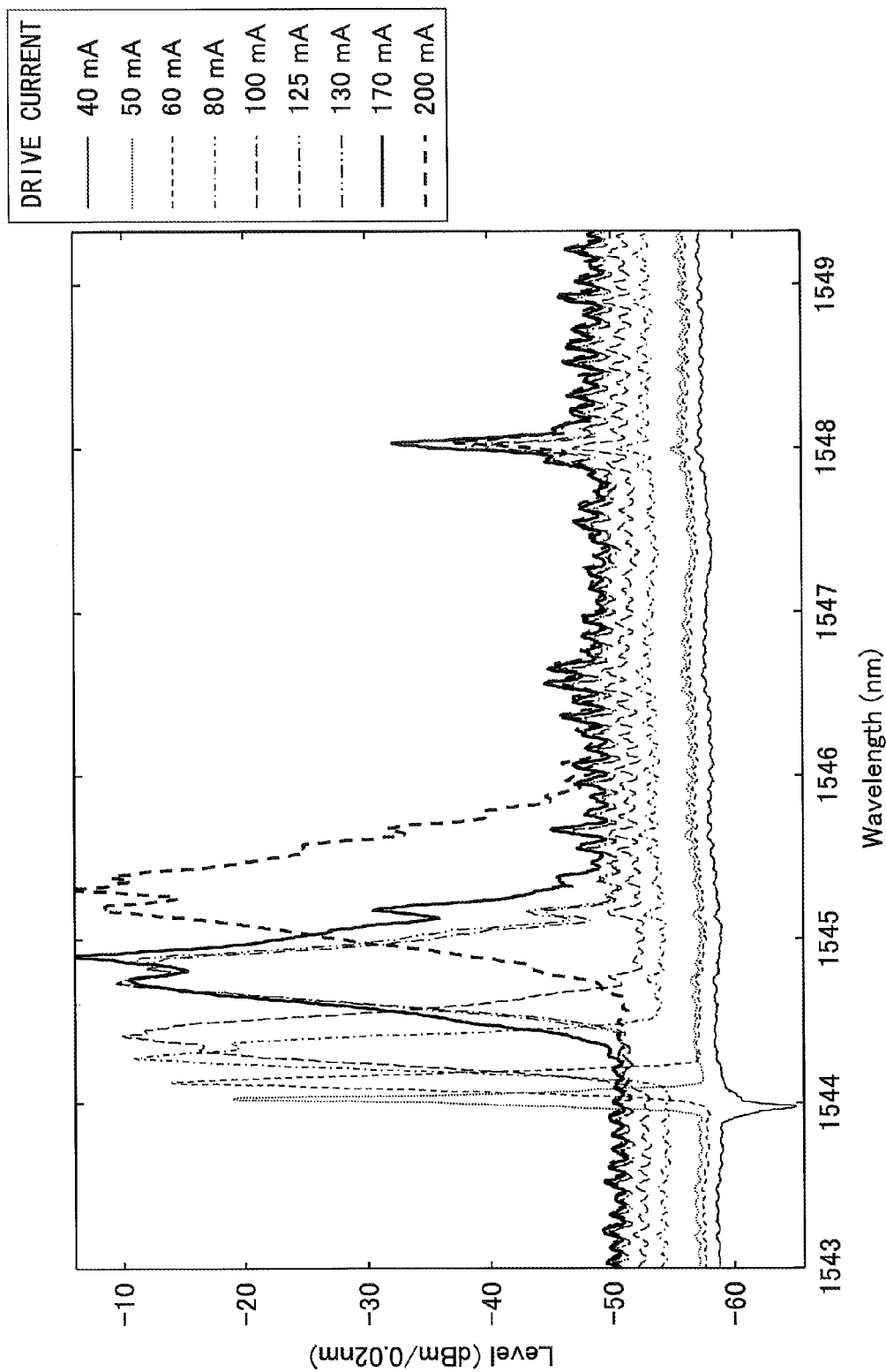
FIG. 3 illustrates an example change in oscillation spectrum when a drive current of an optical semiconductor device is changed in the conventional laser device.
Figure 4:
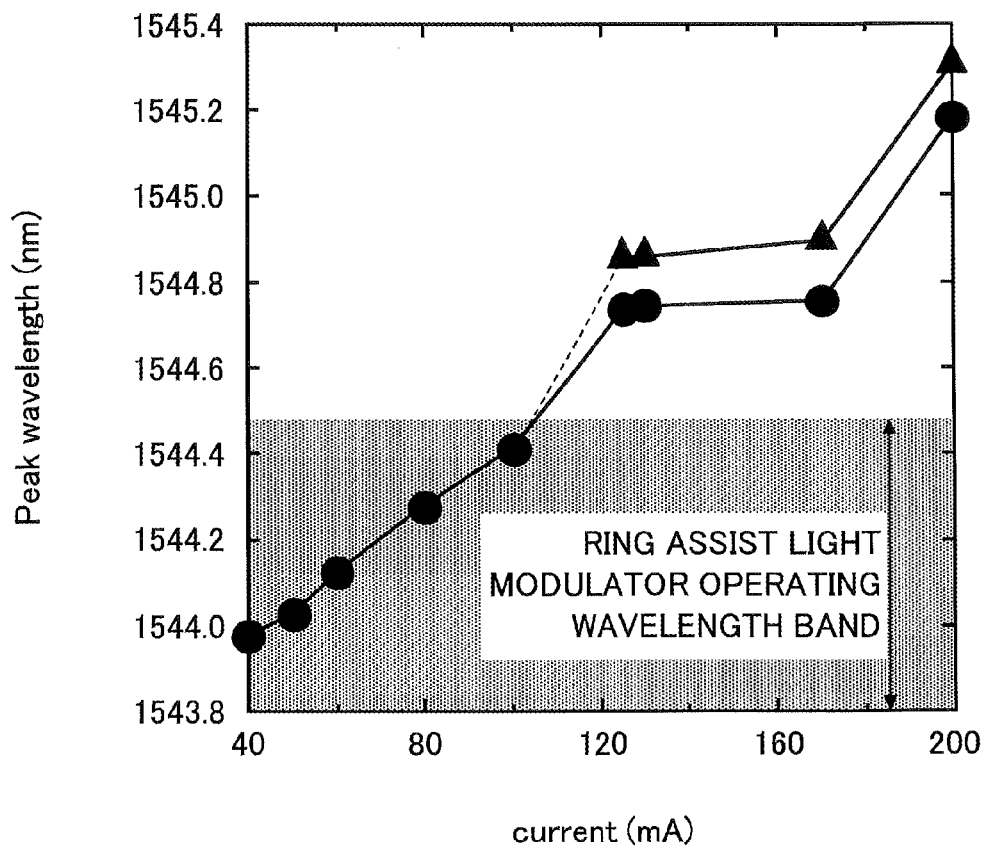
FIG. 4 illustrates an example relationship between the drive current and a peak wavelength of the optical semiconductor device in the conventional laser device.

In related technologies, in a laser device as exemplarily illustrated in FIG. 2, when an injection current to the optical semiconductor device 910 is increased in order to increase the output of the laser light to be emitted, a wavelength is shifted as illustrated in FIG. 3. FIG. 4 illustrates an example relationship between the injection current to the optical semiconductor device 910 and a peak wavelength acquired based on FIG. 3. In a case where the drive current of the optical semiconductor device 910 is relatively low, the oscillation wavelength in the laser device 900 is within an operation wavelength band of the ring assist optical modulator, so that effective light modulation can be performed. When, however, the drive current of the optical semiconductor device 910 is increased, the oscillation wavelength in the laser device 900 is independently shifted on a long wavelength side. When the peak of the oscillation wavelength in the laser device 900 is shifted on the long wavelength side to outside of the operation wavelength band of the ring assist optical modulator 960, it becomes difficult to perform effective light modulation.

Accordingly, it is desired to provide a laser device where no wavelength shift occurs even when the drive current in the optical semiconductor device is increased, that is, a laser device that can increase the intensity of the laser light without causing the wavelength shift.

In a laser device according to an embodiment of the present invention, it becomes possible to increase the intensity of the laser light without causing the wavelength shift.

In the following, embodiments of the present inventions are described. The same reference numerals may be used to describe the same elements, etc., and the repeated descriptions thereof may be omitted.

First Embodiment

Figure 5:
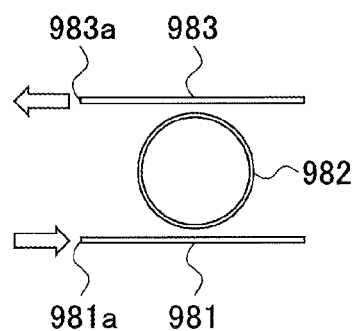
FIG. 5 illustrates an example of a basic structure of a ring resonator.
Figure 6:
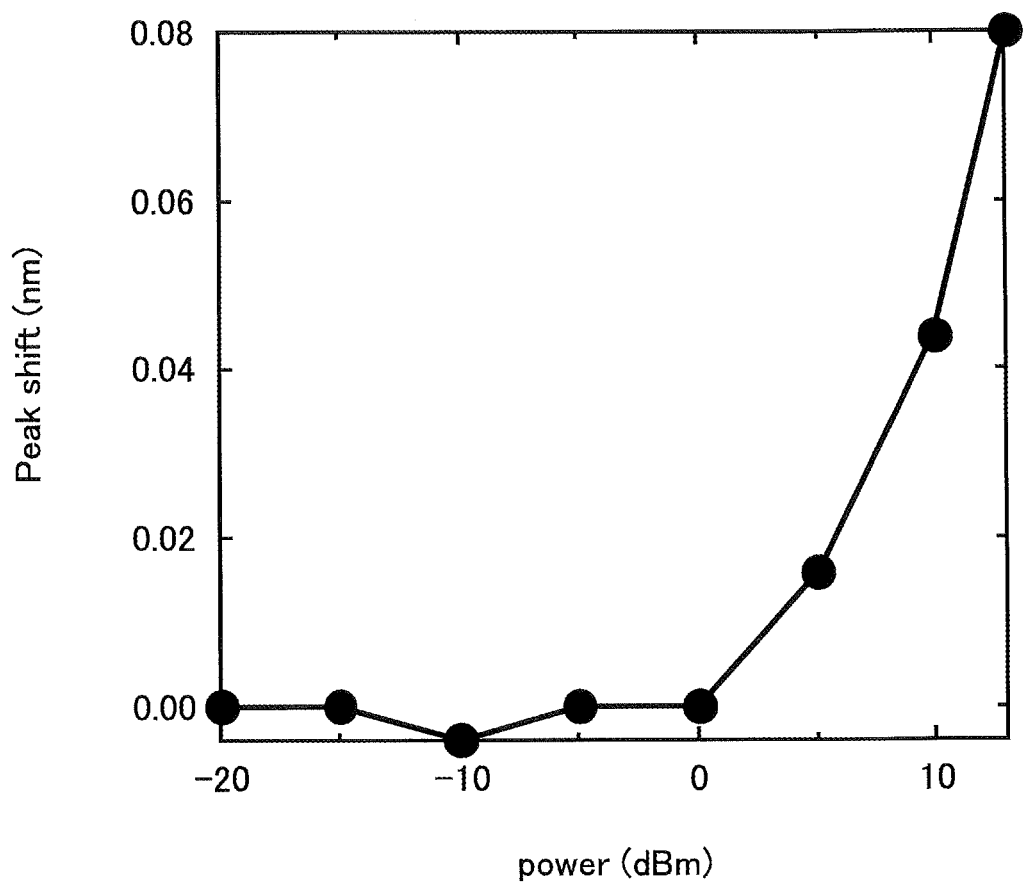
FIG. 6 illustrates an example relationship between an intensity of incident light and a transmission center wavelength in the ring resonator.

First, the inventor of the present invention researched to find a reason why the wavelength of the emitted laser light is shifted when the drive current in the optical semiconductor device 910 is increased. A result of the research is described below. Specifically, in the structure as illustrated in FIG. 5 where a first optical waveguide 981, a ring resonator 982, and a second optical waveguide 983 are formed, the inventor measured an input light intensity dependence of the transmission center wavelength by entering light into an incident end 981a of the first optical waveguide 981 and measuring transparent spectra of the light from an emission end 983a of the second optical waveguide 983 via the ring resonator 982. FIG. 6 illustrates an example relationship between the intensity of incident light and a shifted amount of the transmission center wavelength which is acquired based on a result of the measurement.

Here, the first optical waveguide 981 in FIG. 5 corresponds to the first optical waveguide 951 of the wavelength-selective reflection device 950. In the same manner, the ring resonator 982 corresponds to the ring resonator 952, and the second optical waveguide 983 corresponds to the second optical waveguide 953. Further, in this embodiment, the incident end, the emission end, an incident/emission end may also be called an end surface of the optical waveguide.

As illustrated in FIG. 6, when the intensity of the incident light is increased to exceed a certain intensity, the shift amount of the peak wavelength is suddenly increased. It is thought that such a sudden increase of the peak wavelength is caused by a temperature increase near the ring resonator 982 due to the incident light, which causes the shift of the transmission center wavelength in the ring resonator 982. Therefore, in the laser device 900 including the wavelength-selective reflection device 950 having a structure similar to that illustrated in FIG. 5, the transmission center wavelength in the ring resonator is shifted for the same reason, so that the wavelength of the laser light which is determined based on the transmission center wavelength of the ring resonator is also shifted. When this is considered, however, it is also thought that the peak shift does not occur when the intensity of the laser light which is entering in the wavelength-selective reflection device 950 is not increased even when the output of the laser light, which is emitted from the laser device, is increased.

Laser Device

Figure 7:
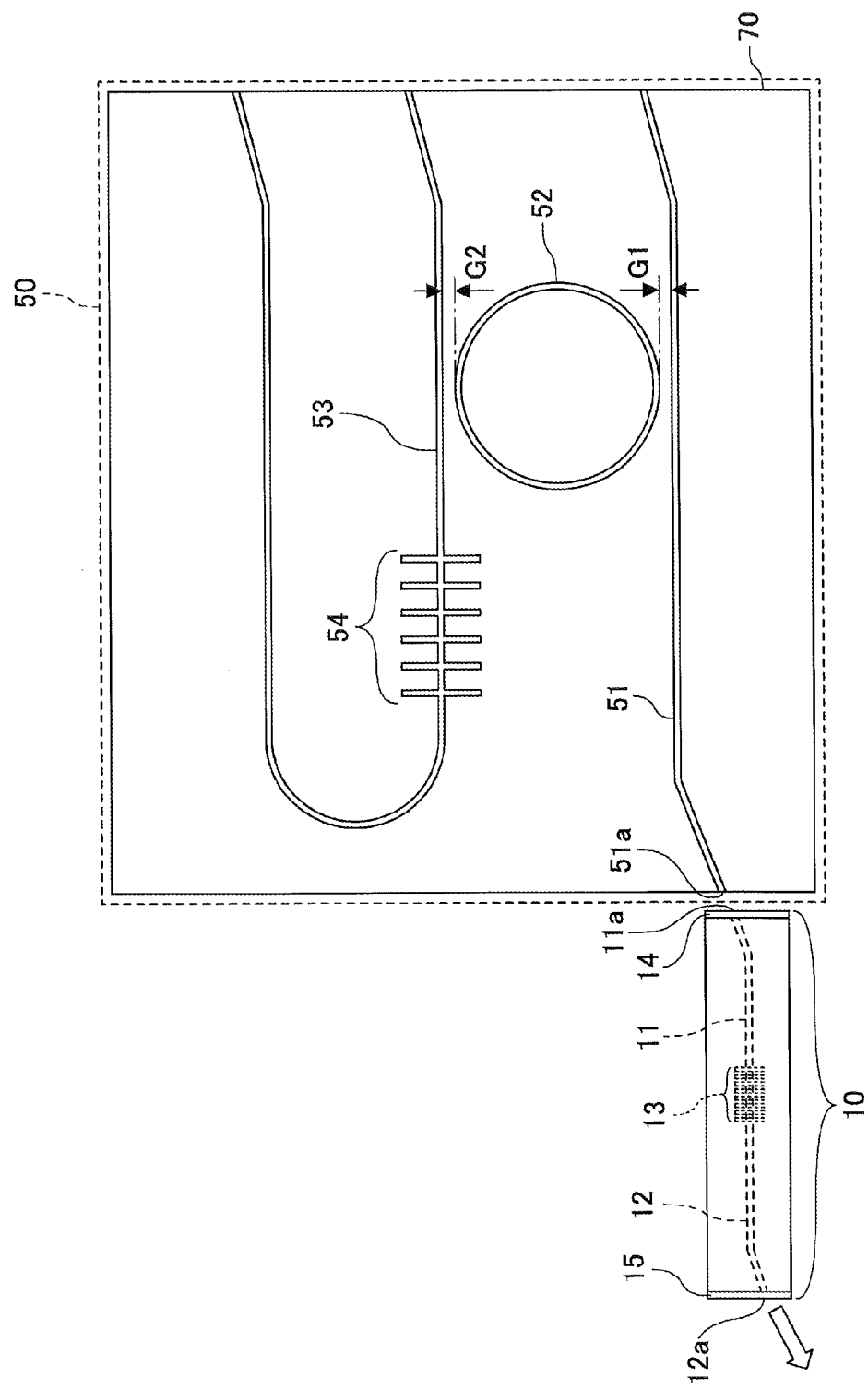
FIG. 7 illustrates an example structure of a laser device according to a first embodiment.

Next, a laser device according to this embodiment is described. FIG. 7 illustrates an example structure of the laser device according to this embodiment. The laser device according to this embodiment includes an optical semiconductor device 10 and a wavelength-selective reflection device 50.

The optical semiconductor device 10 includes gain waveguides which are made of a compound semiconductor material. More specifically, the optical semiconductor device 10 includes a first gain waveguide 11 on one side in the optical semiconductor device 10, and further includes a second gain waveguide 12 on the other side in the optical semiconductor device 10. The optical semiconductor device 10 further includes a distributed Bragg reflector (DBR) waveguide 13 between the first gain waveguide 11 and the second gain waveguide 12. Further, an antireflection film 14 is formed on one facet of the optical semiconductor device 10, which corresponds to an end surface of the first gain waveguide 11. Further, an antireflection film 15 is formed on the other facet of the optical semiconductor device 10, which is opposite to the one surface of the optical semiconductor device 10 and corresponds to an end surface of the second gain waveguide 12. The end surface of the first gain waveguide 11 is an incident/emission end 11*a*, and the end surface of the second gain waveguide 12 is an emission end 12*a* of the second gain waveguide 12.

The wavelength-selective reflection device 50 includes a first optical waveguide 51, a ring resonator 52, a second optical wave guide 53, and a wavelength-selective reflection mirror (DBR waveguide) 54 which is formed in the second optical wave guide 53 and functions as a wavelength-selective reflection mirror that reflects only a specific wavelength. The first optical waveguide 51, the ring resonator 52, the second optical wave guide 53, and the DBR waveguide 54 are formed on a silicon substrate 70, and are formed of, for example, a silicon optical waveguide core which is surrounded by silicon oxide or the like. Specifically, the optical waveguides of the first optical waveguide 51, the ring resonator 52, the second optical wave guide 53, the DBR waveguide 54, etc., are formed by processing a Silicon on Insulator (SOI) substrate, etc. For example, the optical waveguides are formed by using the silicon oxide layer of the SOI substrate as a lower cladding and processing the silicon layer on the silicon oxide layer, and an upper cladding is formed by forming a silicon oxide layer on the formed optical waveguide.

The optical semiconductor device 10 and the wavelength-selective reflection device 50 are installed in a manner such that the incident/emission end 11*a* of the first gain waveguide 11 in the optical semiconductor device 10 faces an incident/emission end 51*a* which is for light incidence and emission in and from the first optical waveguide 51 of the wavelength-selective reflection device 50.

In the laser device according to this embodiment, a resonator is formed by the DBR waveguide 13 of the optical semiconductor device 10 and the ring resonator 52 and the DBR waveguide 54 of the wavelength-selective reflection device 50. In the laser device according to this embodiment, light emission occurs by injecting current in an area where the first gain waveguide 11 of the optical semiconductor device 10 is formed. Further, the emitted light is laser-oscillated by the resonator, and amplified in the second gain waveguide 12. By doing this, it becomes possible to emit the light, which is amplified in the second gain waveguide 12, from the emission end 12*a* of the second gain waveguide 12 in the optical semiconductor device 10 as laser light.

In the laser device according to this embodiment, the function to oscillate laser light and the function to amplify the laser light is separated from each other because the laser oscillation occurs in the resonator including the first gain waveguide 11 and the oscillated laser light is amplified in the second gain waveguide 12. Therefore, it becomes possible to increase the intensity of the laser light by increasing the amount of current injecting in the second gain waveguide 12 even when the amount of current injecting in the first gain waveguide 11 is fixed.

Further, in the case where the current in the first gain waveguide 11 is fixed, even if the intensity of the laser light emitted from the emission end 12*a* is increased by changing the amount of current in the second gain waveguide 12, the intensity of the light which is incident in the wavelength-selective reflection device 50 from the optical semiconductor device 10 remains constant. Therefore, the shift of the transmission center wavelength of the ring resonator 52 in the wavelength-selective reflection device 50 does not occur, and accordingly, the shift of the laser oscillation wavelength does not occur. Therefore, in the laser device according to this embodiment, even when the intensity of the laser light, which is emitted from the emission end 12*a* of the second gain waveguide 12, is increased, the shift of the oscillation wavelength does not occur. Namely, in the laser device according to this embodiment, it becomes possible to emit the laser light having a desired constant wavelength from the emission end 12*a* of the second gain waveguide 12 regardless of the intensity of the emitted laser light. Further, when the amount of the current injecting in the first gain waveguide 11 is fixed to a relatively small value, the light intensity in the ring resonator 52 becomes smaller. Therefore, by doing this, it becomes possible not to shift the transmission center wavelength which is conventionally caused by the heat generate by the incident light, and it becomes possible to maintain the original transmission center wavelength of the ring resonator 52.

Optical Semiconductor Device

Figure 8:
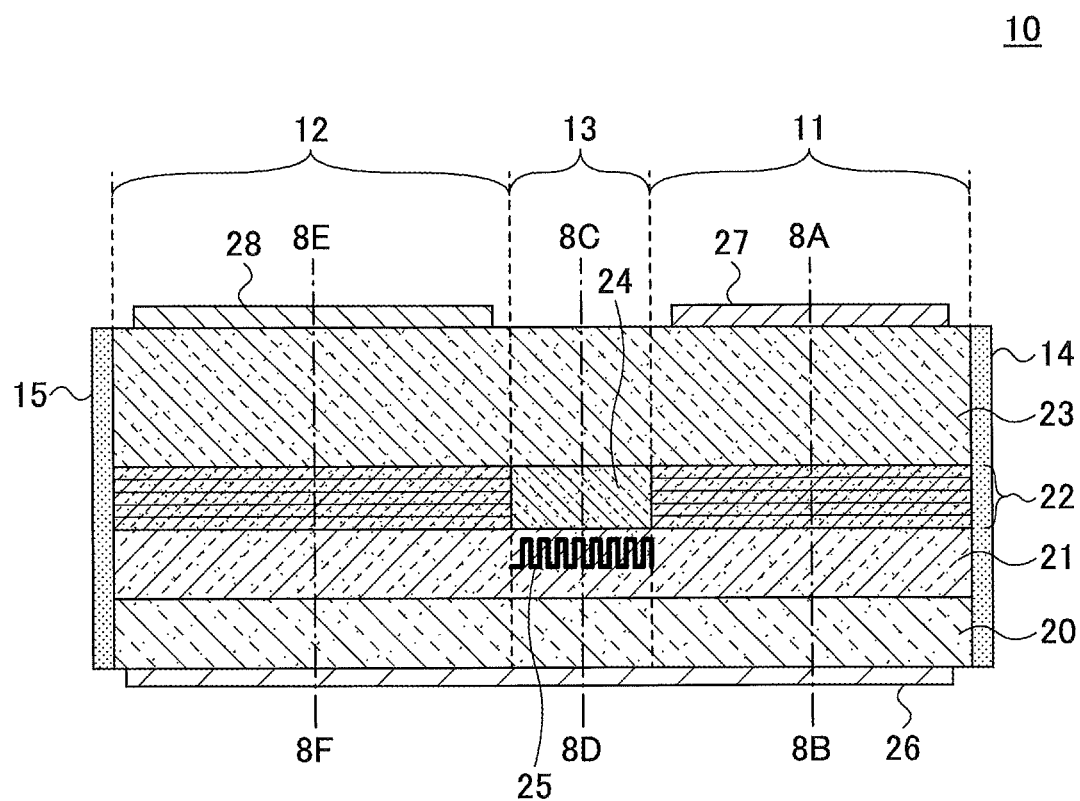
FIG. 8 is a cross-sectional view of waveguides in an optical semiconductor device in a direction parallel to a propagation direction of the waveguides according to the first embodiment.
Figure 9A:
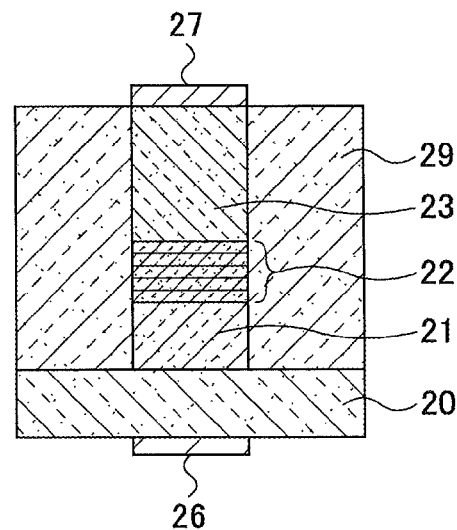
FIGS. 9A through 9C are cross-sectional views of the respective waveguides in the optical semiconductor device in a direction orthogonal to the propagation direction of the waveguides according to the first embodiment.
Figure 9B:
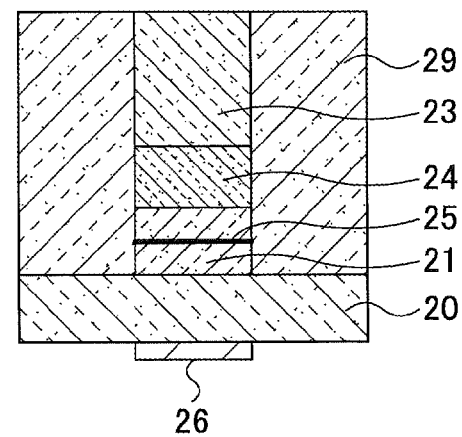
Figure 9C:
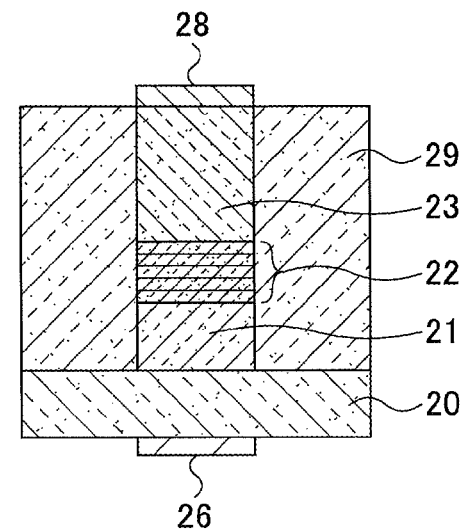

Next, the optical semiconductor device 10 according to this embodiment is described with reference to FIGS. 8 through 9C. Here, FIG. 9A is a cross-sectional view cut along the dashed-dotted line 8A-8B in FIG. 8. FIG. 9B is a cross-sectional view cut along the dashed-dotted line 8C-8D in FIG. 8. FIG. 9C is a cross-sectional view cut along the dashed-dotted line 8E-8F in FIG. 8.

As described above, in the optical semiconductor device 10 according to this embodiment, the first gain waveguide 11 is formed on the one side in the optical semiconductor device 10, the second gain waveguide 12 is formed on the other side in the optical semiconductor device 10, and the DBR waveguide 13 is formed between the first gain waveguide 11 and the second gain waveguide 12. Specifically, the optical semiconductor device 10 is formed by epitaxially-forming semiconductor layers, which are formed of compound semiconductor materials, on an n-InP substrate 20 by using Metal Organic Chemical Vapor Deposition (MOCVD), etc. In the areas where the first gain waveguide 11 and the second gain waveguide 12 are to be formed, an n-InP cladding layer 21, a Multiple Quantum Well (MQW) active layer 22, and a p-InP cladding layer 23 are deposited and formed. Here, a p-InGaAs/p-InGaAsP contact layer may be formed on the p-InP cladding layer 23 to reduce the contact resistance to electrodes. By the MQW active layer 22 formed as described above, the first gain waveguide 11 and the second gain waveguide 12 are formed. The MQW active layer 22 is formed by alternately depositing i-InGaAsP having different compositions. Further, the MQW active layer 22 is formed in a manner such that the total thickness is 100 nm, and Photoluminescence (PL) wavelength is 1.55 µm. By using the InGaAsP material as a core layer, it becomes possible to realize the laser oscillation in the main communication wavelength bands such as 1.3 µm band, 1.55 µm band, etc.

Further, in the area where the DBR waveguide 13 is to be formed, the n-InP cladding layer 21, an optical waveguide core layer 24, and the p-InP cladding layer 23 are deposited and formed. The DBR waveguide 13 is to be formed by the optical waveguide core layer 24 which is formed as described above. The optical waveguide core layer 24 is made of i-InGaAsP having the thickness of 200 nm and the PL wavelength of 1.30 µm. In the n-InP cladding layer 21 in the area where the DBR waveguide 13 is formed, a diffraction grating 25 of n-InGaAsP is formed. The diffraction grating 25 is formed in a manner such that the coupling coefficient and the cycle thereof are adjusted so as to select one of the oscillation wavelengths, which are periodically generated in the ring waveguide in the wavelength-selective reflection device 50, in the wavelength near 1.55 µm.

The first gain waveguide 11, the second gain waveguide 12, and the DBR waveguide 13 are formed in a mesa structure having a width of 1.5 µm. Further, on both sides of the mesa structure, an SI-InP layer 29 is formed which has high resistance and in which Fe is doped as an impurity element. Further, the first gain waveguide 11, the second gain waveguide 12, and the DBR waveguide 13 in the optical semiconductor device 10 according to this embodiment can be formed on the same n-InP substrate 20 by butt-joint growth using an MOCVD technique.

In this embodiment, the length of the formed first gain waveguide 11 is approximately 400 µm, the length of the formed second gain waveguide 12 is approximately 600 µm, and the length of the formed DBR waveguide 13 is approximately 200 µm. Further, the coupling coefficient "κ" in the DBR waveguide 13 is set to be 100 cm−1, and the reflection ratio in the DBR waveguide 13 is approximately 60%.

On the rear surface of the n-InP substrate 20 where the first gain waveguide 11, the second gain waveguide 12, and the DBR waveguide 13 are formed, a lower electrode 26, which functions as a common electrode, is formed. Further, on the p-InP cladding layer 23 in the area where the first gain waveguide 11 is formed, a first upper electrode 27 is formed. Further, on the p-InP cladding layer 23 in the area where the second gain waveguide 12 is formed, a second upper electrode 28 is formed. By forming the first upper electrode 27 and the second upper electrode 28 on the areas where the first gain waveguide 11 and the second gain waveguide 12 are formed, respectively, it becomes possible to independently inject different currents in the first gain waveguide 11 and in the second gain waveguide 12. Here, the first upper electrode 27 and the second upper electrode 28 are formed of Ti/Pt/Au.

Further, in the optical semiconductor device 10 according to this embodiment, the first gain waveguide 11 and the second gain waveguide 12 are formed in a manner such that the first gain waveguide 11 and the second gain waveguide 12 are inclined with respect to the normal lines of the one facet and the other facet of the optical semiconductor device 10 near the respective end surfaces by approximately seven degrees. By doing this, it becomes possible to greatly reduce the reflection ratios at the facets of the optical semiconductor device 10.

Wavelength-Selective Reflection Device

According to this embodiment, the wavelength-selective reflection device 50 is formed by using an SOI substrate where a silicon oxide layer and a silicon layer are sequentially formed on the silicon substrate 70. This SOI substrate is formed by thermal oxidation of Si wafer surface and other Si substrate bonding on the oxidized a Si substrate. Silicon oxide layer has a thickness of approximately 3 µm and the silicon layer has a thickness of approximately 300 nm on the silicon substrate 70. The silicon oxide layer becomes the lower cladding (lower cladding layer). In a method of forming the wavelength-selective reflection device 50, a resist for electron beam lithography is applied on the silicon layer of the SOI substrate, and exposure and development are performed by using an electron beam lithography exposure device, so that a resist pattern (not shown) is formed. This resist pattern is formed on the areas where the first optical waveguide 51, the ring resonator 52, the second optical wave guide 53, and the wavelength-selective reflection mirror 54 are to be formed. After that, a part or all of the silicon layer in the area where the resist pattern is not formed is removed by dry etching such as Reactive Ion Etching (RIE) etc. By doing this, the optical waveguides made of silicon which are to become the first optical waveguide 51, the ring resonator 52, the second optical wave guide 53, and the wavelength-selective reflection mirror 54 are formed.

In this embodiment, the optical waveguides which are to become the first optical waveguide 51, the ring resonator 52, the second optical wave guide 53, and the wavelength-selective reflection mirror 54 are formed as a rib waveguide. The rib waveguide includes a core area, which has a width of approximately 500 nm and a thickness of approximately 300 µm, and a slab area which has a thickness of approximately 50 nm and surrounds the core area. After that, the upper cladding is formed by forming the silicon oxide layer having a thickness of 2 µm on the optical waveguide formed of silicon. By doing this, the wavelength-selective reflection device 50 is formed. Here, the optical waveguides which are to become the first optical waveguide 51, the ring resonator 52, the second optical wave guide 53, and the wavelength-selective reflection mirror 54 may be a so-called channel waveguide where only the core area is formed without the slab area in addition to the rib waveguide.

In this embodiment, it is assumed that the ring resonator 52 is formed in a manner such that the radius of the ring resonator 52 is 8 µm and both the gap "G1" between the first optical waveguide 51 and the ring resonator 52 and the gap "G2"

between the first optical waveguide 51 and the ring resonator 52 are approximately 300 nm. Further, in the area where the length of the second optical wave guide 53 is approximately 500 μm, the wavelength-selective reflection mirror 54 is formed by forming side-surface diffraction gratings having a length of approximately 3 μm and a pitch of approximately 300 nm. Further, the reflection wavelength band of the wavelength-selective reflection mirror 54 is set to correspond to that of the DBR waveguide 13 in the optical semiconductor device 10, and the wavelength of the wavelength-selective reflection mirror 54 is set to correspond to one wavelength among the periodic transmission wavelengths of the ring resonator 52. In the wavelength-selective reflection device 50 in this embodiment, the end surfaces of the first optical waveguide 51 and the second optical wave guide 53 are inclined relative to the normal lines of the end surfaces of the wavelength-selective reflection device 50 by approximately 15 degrees. Further, the first optical waveguide 51 and the second optical wave guide 53 are formed in a taper shape in a manner such that the widths of the header portions of the first optical waveguide 51 and the second optical wave guide 53 become narrower as the distances to the respective end surfaces are reduced, as schematically illustrated in FIG. 7.

Further, in this embodiment, after the position of the incident/emission end 11a of the first gain waveguide 11 in the optical semiconductor device 10 and the position of the incident/emission end 51a of the first optical waveguide 51 in the wavelength-selective reflection device 50 are aligned with each other, the optical semiconductor device 10 and the wavelength-selective reflection device 50 are fixed to each other. Specifically, the optical semiconductor device 10 and the wavelength-selective reflection device 50 are fixed to each other by interposing a resin material (not shown) for matching the refractive indexes. By doing this, the laser device according to this embodiment can be manufactured.

In the laser device according to this embodiment, the laser oscillation occurs in the resonator including the first gain waveguide 11 and the resonator, and the oscillated laser light is amplified in the second gain waveguide 12. Therefore, the function to oscillate laser light and the function to amplify the laser light are separated. Therefore, it becomes possible to increase the intensity of the emitted laser light without shifting the laser oscillation wavelength by fixing the amount of the current to inject in the first gain waveguide 11 and increasing the amount of the current to inject in the second gain waveguide 12.

Second Embodiment

Figure 10:
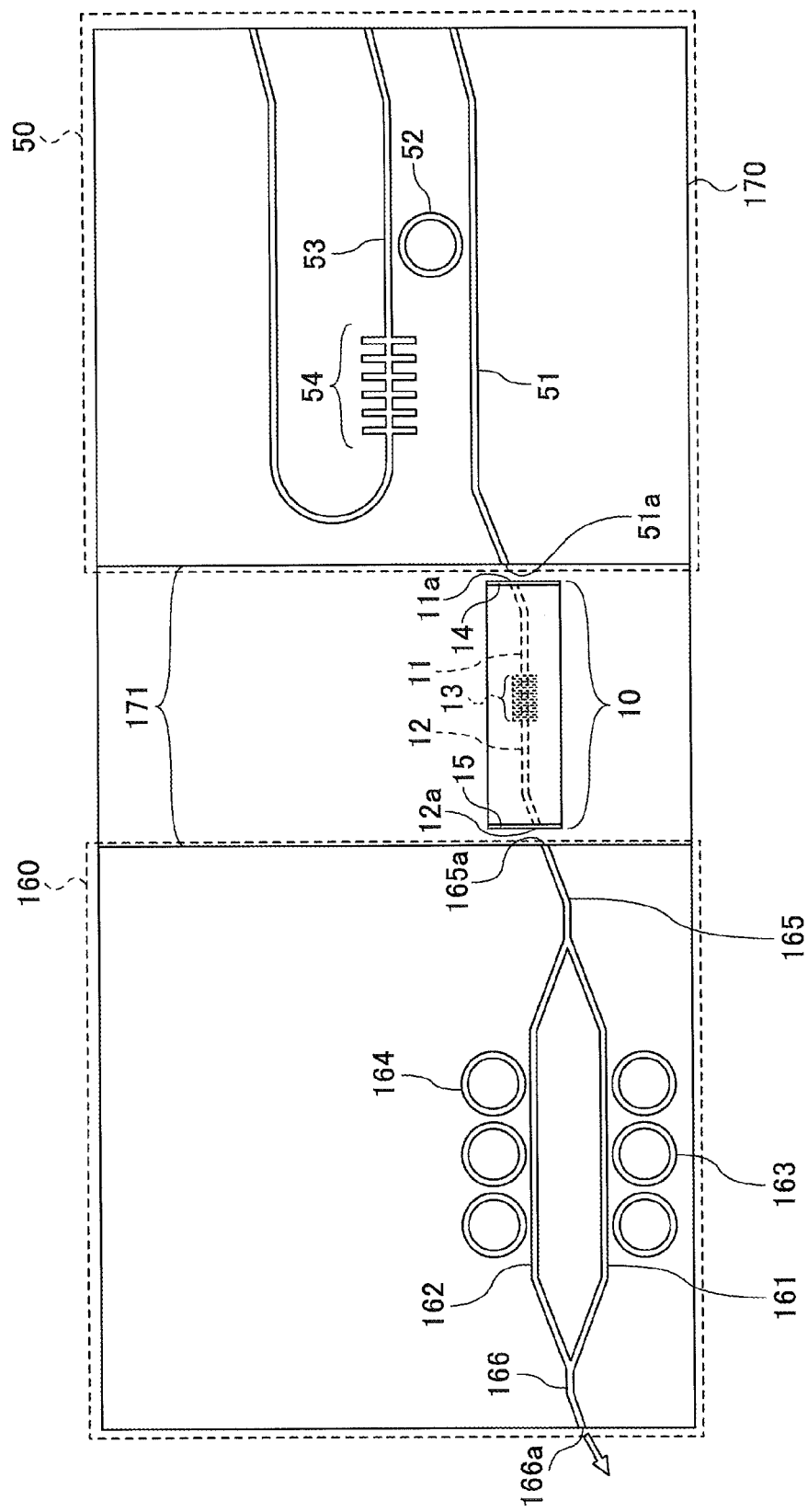
FIG. 10 illustrates an example structure of a light modulation device according to a second embodiment.

Next, a second embodiment is described. In this embodiment, a ring assist optical modulator 160 as illustrated in FIG. 10 is provided on the end facet of the emission end 12a of the optical semiconductor device 10 which emits laser light in the laser device according to the first embodiment. Specifically, the wavelength-selective reflection device 50 and the ring assist optical modulator 160 are formed on the same silicon substrate 170. Further, in the silicon substrate 170 between the wavelength-selective reflection device 50 and the ring assist optical modulator 160, a groove section 171 is formed. In this embodiment, the optical semiconductor device 10 according to the first embodiment is provided in the groove section 171.

In this embodiment, between the optical semiconductor device 10 and the wavelength-selective reflection device 50, the position of the incident/emission end 11a of the first gain waveguide 11 in the optical semiconductor device 10 and the position of the incident/emission end 51a of the first optical waveguide 51 in the wavelength-selective reflection device 50 are aligned with each other. Further, between the optical semiconductor device 10 and the ring assist optical modulator 160, the position of the emission end 12a of the second gain waveguide 12 in the optical semiconductor device 10 and the position of an incident end 165a of an optical waveguide 165 in the ring assist optical modulator 160 are aligned with each other. As described above, the optical semiconductor device 10 is set on the silicon substrate 170 in a manner such that the position of the optical semiconductor device 10 is aligned with the position of the wavelength-selective reflection device 50 and the position of the ring assist optical modulator 160.

The ring assist optical modulator 160 includes a first modulation optical waveguide 161 and a second modulation optical waveguide 162. The first modulation optical waveguide 161 and the second modulation optical waveguide 162 are connected to an optical waveguide 166 on the light emission side. Further, plural ring resonators 163 are formed near a side part of the first modulation optical waveguide 161, and plural ring resonators 164 are formed near a side part of the second modulation optical waveguide 162.

The laser light, which is emitted from the emission end 12a of the second gain waveguide 12 in the optical semiconductor device 10, enters in the incident end 165a of the optical waveguide 165 in the ring assist optical modulator 160, and transmits through the optical waveguide 165. After that, the laser light is divided into two laser light beams. One is the laser light that transmits through the first modulation optical waveguide 161 and the other is the laser light that transmits through the second modulation optical waveguide 162. In the ring assist optical modulator 160, it is possible to separately modulate the phases of the laser light beams that transmit through the first modulation optical waveguide 161 and the second modulation optical waveguide 162 by applying voltages to the first modulation optical waveguide 161 and/or the second modulation optical waveguide 162. After that, the laser light beam transmitting through the first modulation optical waveguide 161 and the laser light beam transmitting through the second modulation optical waveguide 162 are combined in the optical waveguide 166 into laser light, and the combined laser light is emitted from an emission end 166a of the optical waveguide 166. As described above, the laser light, which is emitted from the emission end 166a of the optical waveguide 166, is formed by combining the laser light whose phase is modulated in the first modulation optical waveguide 161 or the second modulation optical waveguide 162. The laser light is emitted from the emission end 166a of the optical waveguide 166 as modulated signal light whose light intensity is modulated in accordance with the phase difference between the first modulation optical waveguide 161 and the second modulation optical waveguide 162.

Further, in this embodiment, the ring resonator 52 in the wavelength-selective reflection device 50 and the ring resonators 163 and 164 in the ring assist optical modulator 160 are formed so as to have the same shape. By forming those ring resonators 52, 163, and 164 so as to have the same shape, it becomes possible that the oscillation wavelength of the ring resonator 52 in the wavelength-selective reflection device 50 is equal to the oscillation wavelength in the ring assist optical modulator 160, and that the oscillation wavelength of the laser is equal to the operating wavelength of the modulator without being influenced by temperature change, etc. Further, similar to the first embodiment, even when the light output on the emission end 12a side of the optical semiconductor device 10 is increased by setting the current value in the first gain waveguide 11 of the optical semiconductor device 10 to a fixed relatively low value and increasing the current value in the second gain waveguide 12, it becomes possible to control (reduce) the shift of the transmission center wavelength of the ring resonator 52 in the wavelength-selective reflection device 50 and prevent the occurrence of change of the laser oscillation wavelength. As a result, it becomes possible to increase the laser light intensity without causing a difference between the operating wavelength of the modulator and the oscillation wavelength of the laser.

Further, the first modulation optical waveguide 161, the second modulation optical waveguide 162, the optical waveguides 165 and 166, and the plural ring resonators 163 and 164 in the ring assist optical modulator 160 are formed in the same structure as that of the first optical waveguide 51, etc., in the wavelength-selective reflection device 50. Therefore, it becomes possible to form the first modulation optical waveguide 161, the second modulation optical waveguide 162, the optical waveguides 165 and 166, and the plural ring resonators 163 and 164 in the ring assist optical modulator 160 at the same time when the first optical waveguide 51, etc., in the wavelength-selective reflection device 50 are formed.

Further, in the above description, a case is described where the optical semiconductor device 10 is set on the silicon substrate 170 in a manner such that the upper surface of the optical semiconductor device 10, etc., face upward. However, a structure of a flip chip mounting may be used in a manner such that the upper surfaces of the optical semiconductor device face downward. In this case, the positions of the optical waveguides can be accurately controlled from the core part of the optical waveguides to the thickness of the upper cladding part in the epitaxial growth. Therefore, for example, it become possible to perform optical coupling between the first optical waveguide 51, etc., and the optical semiconductor device 10 more accurately by passive alignment.

Third Embodiment

Figure 11:
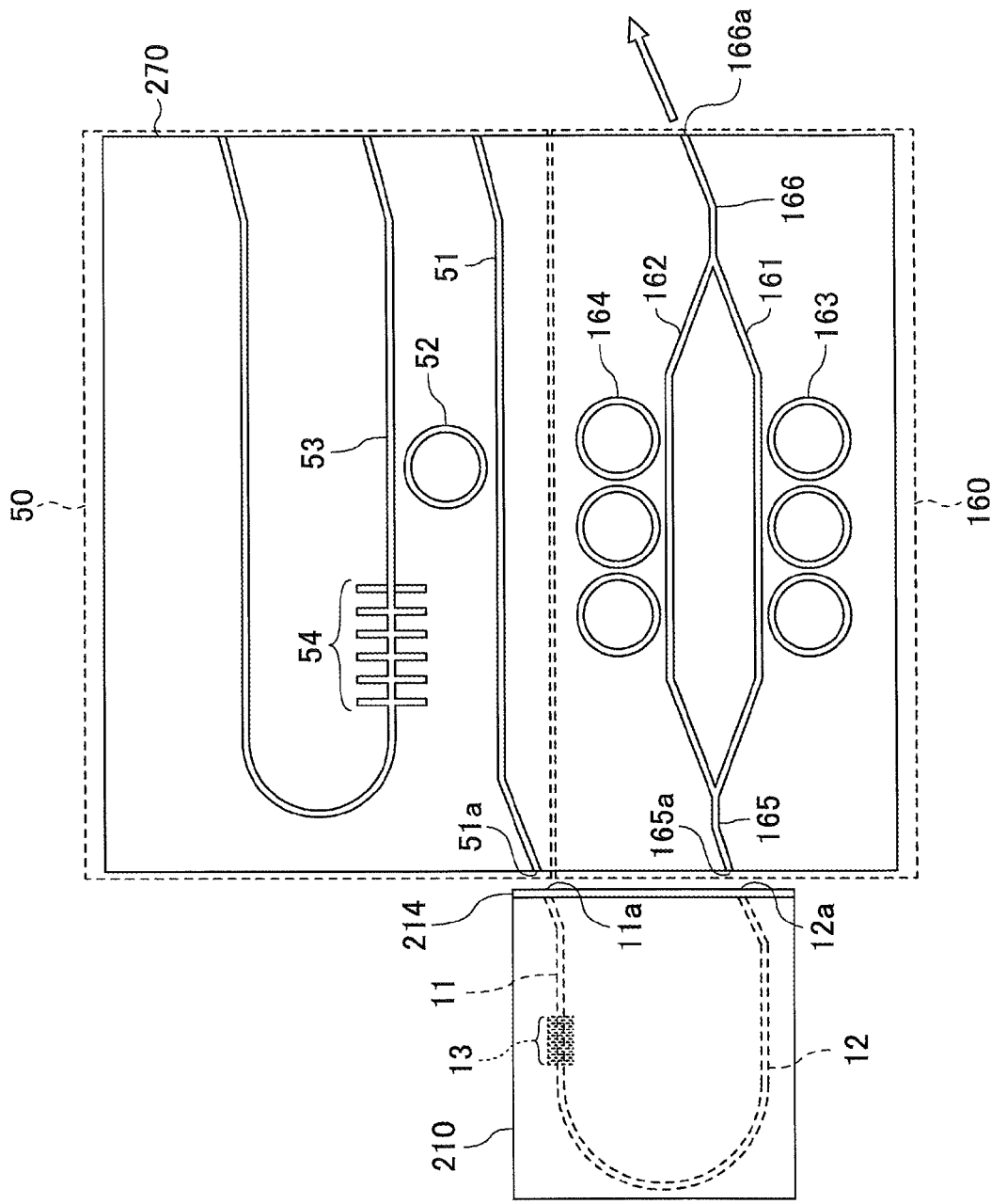
FIG. 11 illustrates an example structure of a light modulation device according to a third embodiment.

Next, a third embodiment is described. In this embodiment, a light modulation device as illustrated in FIG. 11 is described where both the incident/emission end 11a of the first gain waveguide 11 and the emission end 12a of the second gain waveguide 12 are formed on the same side of an optical semiconductor device 210. Due to this structure, in this embodiment, as illustrated in FIG. 11, the second gain waveguide 12 is formed in a curved manner, that is, formed in a U-shaped form. Further, in this embodiment, an antireflection film 214 is formed only on one side of the optical semiconductor device 210.

Further, the wavelength-selective reflection device 50 and the ring assist optical modulator 160 are formed on the same silicon substrate 270. Accordingly, the incident/emission end 51a of the first optical waveguide 51 in the wavelength-selective reflection device 50 and the incident end 165a of the optical waveguide 165 in the ring assist optical modulator 160 are formed on the same side surface of the silicon substrate 270. Due to this, it becomes easier to align the position of the optical semiconductor device 210 and the positions of the wavelength-selective reflection device 50 and the ring assist optical modulator 160. Namely, an optical alignment between the first gain waveguide 11 and the first optical waveguide 51 and an optical alignment between the second gain waveguide 12 and the optical waveguide 165 can be done at one time. Therefore, in this embodiment, it becomes possible to reduce the manufacturing process, so that the light modulation device can be manufactured at low cost. Further, the wavelength-selective reflection device 50 and the ring assist optical modulator 160 are formed on the same side relative to the optical semiconductor device 210. Therefore, it is not necessary to form a groove, etc., so that it becomes possible to reduce the size of the light modulation device. Further, the ring resonator 52 and the ring resonators 163 and 164 can be formed in a manner such that the ring resonator 52 and the ring resonators 163 and 164 are closer to each other. Therefore, it becomes possible to further reduce the influence of the wavelength shift due to temperature change.

In the above description, a structure is described where the second gain waveguide 12 of the optical semiconductor device 210 is formed in a U-shaped form. However, in this embodiment, a reflection-type 2×2 multimode interference waveguide may be disposed near the end surface of the optical semiconductor device 210 so as to return light in the optical semiconductor device 210. In this case, it is not necessary to bend the second gain waveguide 12. Therefore, it becomes possible to further reduce the size of the optical semiconductor device 210.

The configuration other than described above is similar to that in the first embodiment.

Fourth Embodiment

Figure 12:
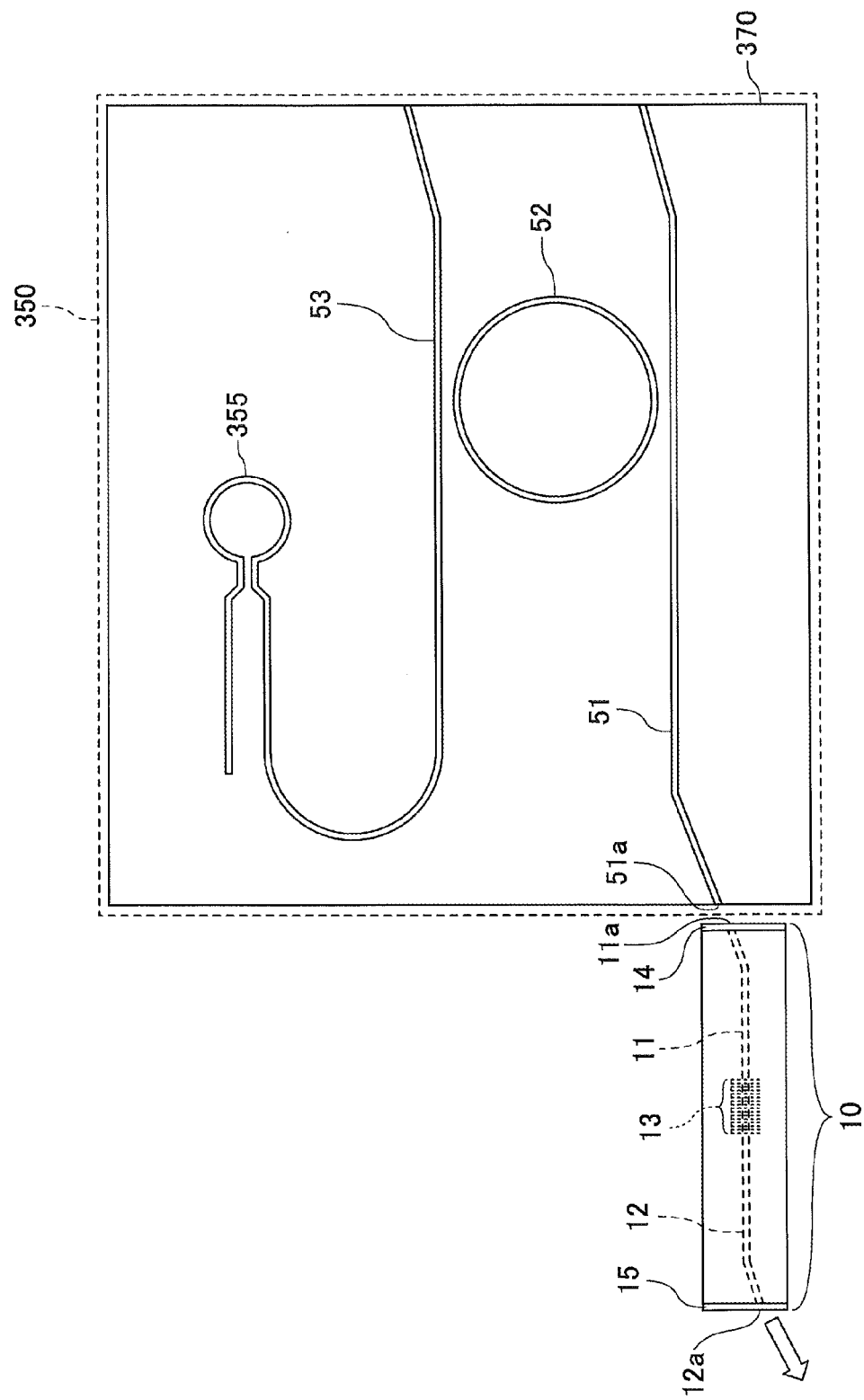
FIG. 12 illustrates an example structure of a laser device according to a fourth embodiment.

Next, a fourth embodiment is described. In this embodiment, as illustrated in FIG. 12 a laser device is described where a wavelength-selective reflection device 350 includes a loop mirror 355 having extremely small wavelength dependence in place of the DBR waveguide 54 of the first embodiment. The loop mirror 355 has a characteristic to form a reflection mirror having high reflection rate regardless of the wavelength by forming an optical waveguide having a loop shape without forming an end surface, etc. Due to the characteristic, the loop mirror appears promising when the loop mirror is applied to a device using a silicon waveguide which is expected to be integrated in high density. As described, in the laser device according to this embodiment, one of the resonation wavelengths of ring resonator 52, which is selected by the DBR the optical semiconductor device 10, becomes the oscillation wavelength.

Figure 13:
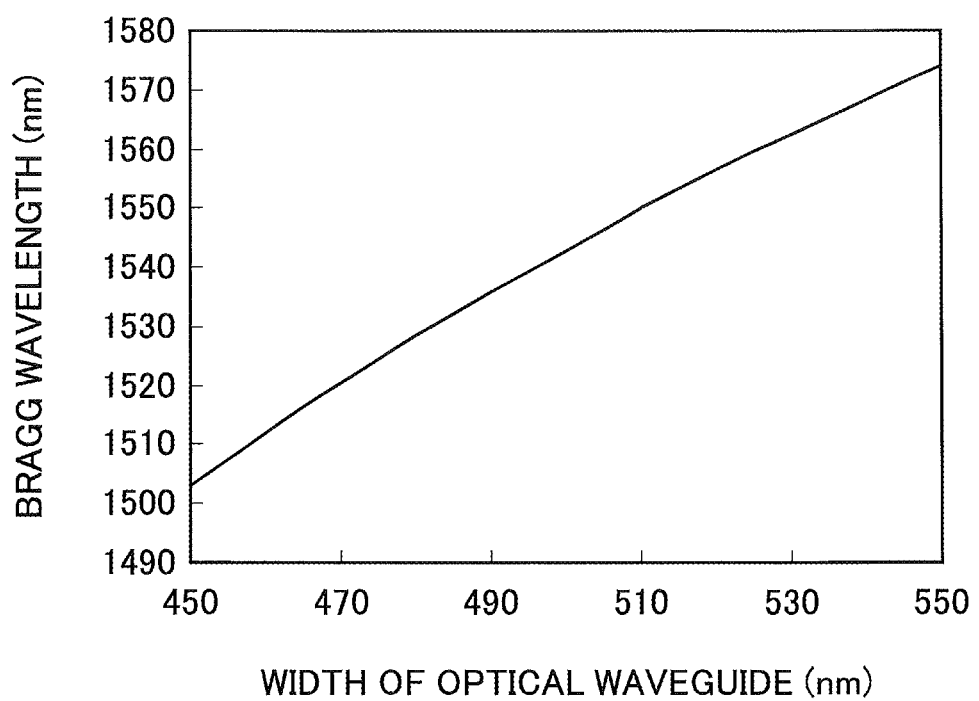
FIG. 13 illustrates an example relationship between a width of an optical waveguide and a Bragg wavelength in the waveguide which is formed of silicon.
Figure 14:
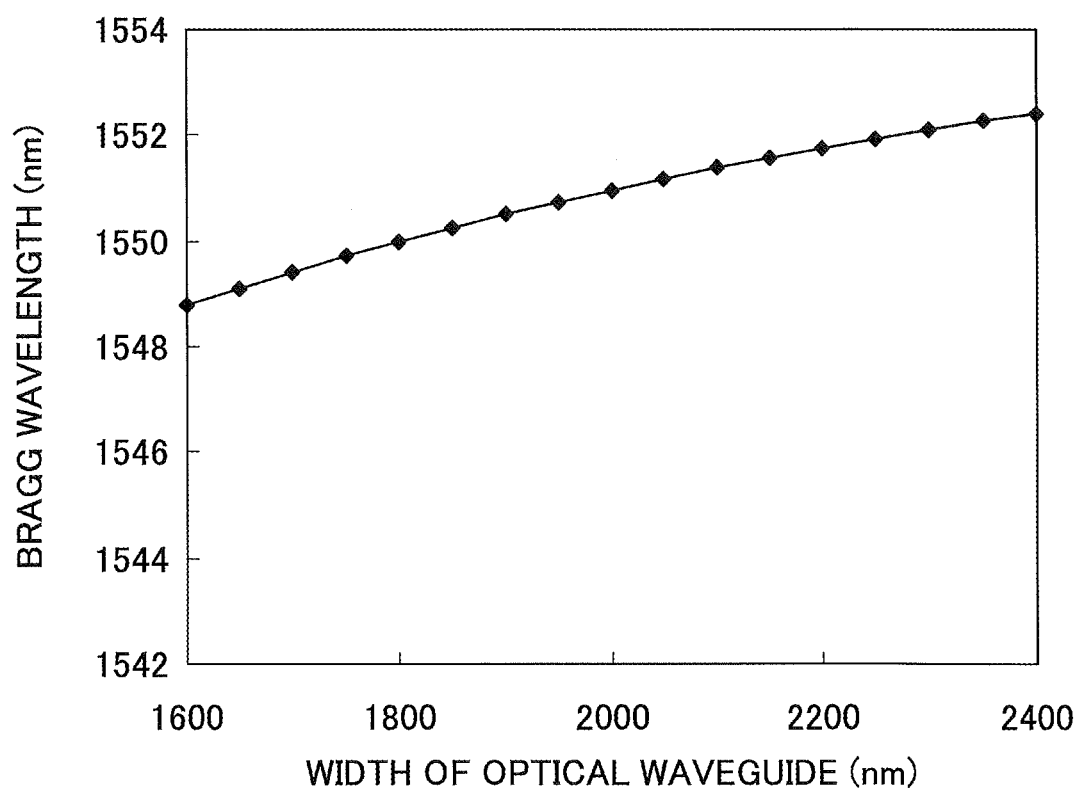
FIG. 14 illustrates an example relationship between the width of an optical waveguide and the Bragg wavelength in the waveguide formed of a compound semiconductor.

FIG. 13 illustrates an example relationship between the width of the optical waveguide in the DBR waveguide 54 formed of silicon and the Bragg wavelength in the wavelength-selective reflection device 50. Further, FIG. 14 illustrates an example relationship between the width of the optical waveguide in the DBR waveguide 13 formed of a compound semiconductor and the Bragg wavelength in the optical semiconductor device 10. As illustrated in FIGS. 13 and 14, the dependence of the Bragg wavelength relative to the width of the optical waveguide in the DBR waveguide 54 formed in the wavelength-selective reflection device 50 in FIG. 13 is greater than the dependence of the Bragg wavelength relative to the width of the optical waveguide in the DBR waveguide 13 formed in the optical semiconductor device 10 in FIG. 14. In other words, the dependence of the Bragg wavelength in the DBR waveguide 54 formed in the wavelength-selective reflection device 50 in FIG. 13 on the width of the optical waveguide is greater than the dependence of the Bragg wavelength in the DBR waveguide 13 formed in the optical semiconductor device 10 in FIG. 14 on the width of the optical waveguide. Due to this, in the DBR waveguide 54, etc., if the width of the optical waveguide differs due to a manufacturing failure, etc., the selected wavelength may differ from the desired wavelength. However, according to this embodiment, the function to select one of the oscillation wavelengths of the ring resonator is provided not in the loop mirror 355 of the wavelength-selective reflection device 350 but in the DBR waveguide 13 of the optical semiconductor device 10. By doing this, it becomes possible to set the oscillation wavelength to a desired value more accurately. Therefore, it becomes possible to further improve the uniformity of the oscillation wavelength of the laser light.

The configuration other than described above is similar to that in the first embodiment. Further, the laser device in this embodiment may also be used similar to the laser device of the first embodiment in the light modulation device in the second and the third embodiments.

All examples and conditional language recited herein are intended for pedagogical purposes to aid the reader in understanding the invention and the concepts contributed by the inventor(s) to furthering the art, and are to be construed as being without limitation to such specifically recited examples and conditions, nor does the organization of such examples in the specification relate to a showing of superiority or inferiority of the invention. Although the embodiments of the present inventions has been described in detail, it is to be understood that various changes, substitutions, and alterations could be made hereto without departing from the spirit and scope of the invention.

What is claimed is:

1. A laser device comprising:
    an optical semiconductor device formed of a compound semiconductor material; and
    a wavelength-selective reflection device including optical waveguides,
    wherein the optical semiconductor device includes
        a first gain waveguide,
        a second gain waveguide,
        a DBR waveguide formed between the first gain waveguide and the second gain waveguide,
        a first electrode configured to inject current in the first gain waveguide,
        a second electrode configured to inject current in the second gain waveguide, and
        an antireflection film formed on a device facet to which the second gain waveguide is connected,
    wherein the optical waveguides in the wavelength-selective reflection device reflect light having a predetermined wavelength from incident light in the optical waveguides, and
    wherein the first gain waveguide is optically coupled with the wavelength-selective reflection device, so that a laser resonator is formed by the DBR waveguide and the wavelength-selective reflection device, and the first gain waveguide functions as a gain medium.

2. The laser device according to claim 1,
    wherein another antireflection film is formed on a facet to which the first gain waveguide is connected in the optical semiconductor device.

3. The laser device according to claim 1,
    wherein there is further disposed an optical waveguide which is optically connected to the second gain waveguide of the optical semiconductor device and is formed on a same substrate on which the wavelength-selective reflection device is formed.

4. The laser device according to claim 1,
    wherein the first gain waveguide, the second gain waveguide, and the DBR waveguide are formed of a material including InP.

5. The laser device according to claim 1,
    wherein core layers of the first gain waveguide, the second gain waveguide, and the DBR waveguide are formed of a material including InGaAsP.

6. The laser device according to claim 1,
    wherein a band gap wavelength in a compound semiconductor material forming a core layer of the DBR waveguide is shorter than a band gap wavelength in a compound semiconductor material forming core layers of the first gain waveguide and the second gain waveguide.

7. The laser device according to claim 1,
    wherein the first gain waveguide, the second gain waveguide, and the DBR waveguide are formed on a lower cladding which is formed of a compound semiconductor material including a first conductivity type of InP, and
    wherein an upper cladding, which is formed of a compound semiconductor material including a second conductivity type of InP, is formed on the first gain waveguide, the second gain waveguide, and the DBR waveguide.

8. The laser device according to claim 7,
    wherein a diffraction grating is formed in the lower cladding in the area where the DBR waveguide is formed.

9. The laser device according to claim 1,
    wherein intensity of laser light which is emitted from a facet of the second gain waveguide can be changed by fixing a current in the first gain waveguide and changing a current in the second gain waveguide.

10. The laser device according to claim 1,
    wherein a facet to which the first gain waveguide of the optical semiconductor device is connected is opposite to the facet to which the second gain waveguide of the optical semiconductor device is connected.

11. The laser device according to claim 1,
    wherein a facet to which the first gain waveguide is connected and a facet to which the second gain waveguide is connected are same.

12. The laser device according to claim 1,
    wherein the wavelength-selective reflection device includes
        a first optical waveguide,
        a second optical waveguide,
        a ring resonator formed between the first optical waveguide and the second optical waveguide and formed of an optical waveguide,
        a reflection mirror formed in a part of the second optical waveguide.

13. The laser device according to claim 12,
    wherein the reflection mirror is formed by periodically changing a width of an optical waveguide.

14. The laser device according to claim 12,
    wherein the reflection mirror is a loop mirror.

15. The laser device according to claim 1,
    wherein the optical waveguides are Si optical waveguides.

16. A light modulation device comprising:
    the laser device according to claim 1; and
    an optical modulator,
    wherein laser light, which is emitted from a facet of the second gain waveguide, coupled to an end surface of an optical waveguide in the optical modulator, and then, the laser light is modulated in the optical modulator and is emitted from other end surface of an optical waveguide of the optical modulator.

17. The light modulation device according to claim 16,
    wherein a ring resonator is formed at least at a part of the optical modulator.

18. The light modulation device according to claim 17,
    wherein a circumference length of a ring resonator in the wavelength-selective reflection device is the same as the circumference length of the ring resonator formed in the optical modulator.

19. The light modulation device according to claim 16, wherein the wavelength-selective reflection device and the optical modulator are formed on a same substrate.

20. An optical semiconductor device comprising:
a first gain waveguide formed of a compound semiconductor material;
a second gain waveguide formed of a compound semiconductor material;
a DBR waveguide formed between the first gain waveguide and the second gain waveguide and formed of a compound semiconductor;
a first electrode configured to inject current in the first gain waveguide; and
a second electrode configured to inject current in the second gain waveguide,
wherein an antireflection film is formed on a facet to which the first gain waveguide is connected and a facet to which the second gain waveguide is connected.

* * * * *